United States Patent
Lee et al.

(10) Patent No.: US 8,488,395 B2
(45) Date of Patent: Jul. 16, 2013

(54) KEEPERS, INTEGRATED CIRCUITS, AND SYSTEMS THEREOF

(75) Inventors: Cheng Hung Lee, Hsinchu (TW); Ching-Wei Wu, Caotun Town (TW); Bin Sheng, Yixing (CN); Hung-Jen Liao, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 581 days.

(21) Appl. No.: 12/754,733

(22) Filed: Apr. 6, 2010

(65) Prior Publication Data

US 2010/0259999 A1 Oct. 14, 2010

Related U.S. Application Data

(60) Provisional application No. 61/169,128, filed on Apr. 14, 2009.

(51) Int. Cl.
*G11C 7/00* (2006.01)

(52) U.S. Cl.
USPC ............. 365/189.09; 365/189.06; 365/189.11

(58) Field of Classification Search
USPC ................... 365/203, 189.09, 189.11, 189.06
See application file for complete search history.

(56) References Cited

U.S. PATENT DOCUMENTS

2006/0001442 A1* 1/2006 Wood et al. ......................... 326/9
2008/0169837 A1* 7/2008 Abadeer et al. ................... 326/82

* cited by examiner

*Primary Examiner* — Richard Elms
*Assistant Examiner* — Hien Nguyen
(74) *Attorney, Agent, or Firm* — Lowe Hauptman Ham & Berner, LLP

(57) ABSTRACT

A keeper of an integrated circuit includes a first transistor having a first gate being coupled with an output end of an inverter. A second transistor is coupled with the first transistor in series. The second transistor has a second gate being coupled with an input end of the inverter.

18 Claims, 9 Drawing Sheets

KEEPERS, INTEGRATED CIRCUITS, AND SYSTEMS THEREOF

RELATED APPLICATIONS

The present application is based on, and claims priority from, U.S. Provisional No. 61/169,128, entitled "KEEPERS, INTEGRATED CIRCUITS, and SYSTEMS THEREOF" filed on Apr. 14, 2009, the disclosure of which is hereby incorporated by reference herein in its entirety.

TECHNICAL FIELD

The present disclosure relates generally to the field of semiconductor circuits, and more particularly, to keepers, integrated circuits, and systems thereof.

BACKGROUND

Memory circuits have been used in various applications. Conventionally, memory circuits can include DRAM, SRAM, and non-volatile memory circuits. A SRAM circuit includes a plurality of memory cells. For a conventional 6-T static memory in which arrays of memory cells are provided, each of the memory cells consists of six transistors. The 6-T SRAM memory cell is coupled with a bit line BL, a bit line bar BLB, and a word line. Four of the six transistors form two cross-coupled inverters for storing a datum representing "0" or "1". The remaining two transistors serve as access transistors to control the access of the datum stored within the memory cell.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
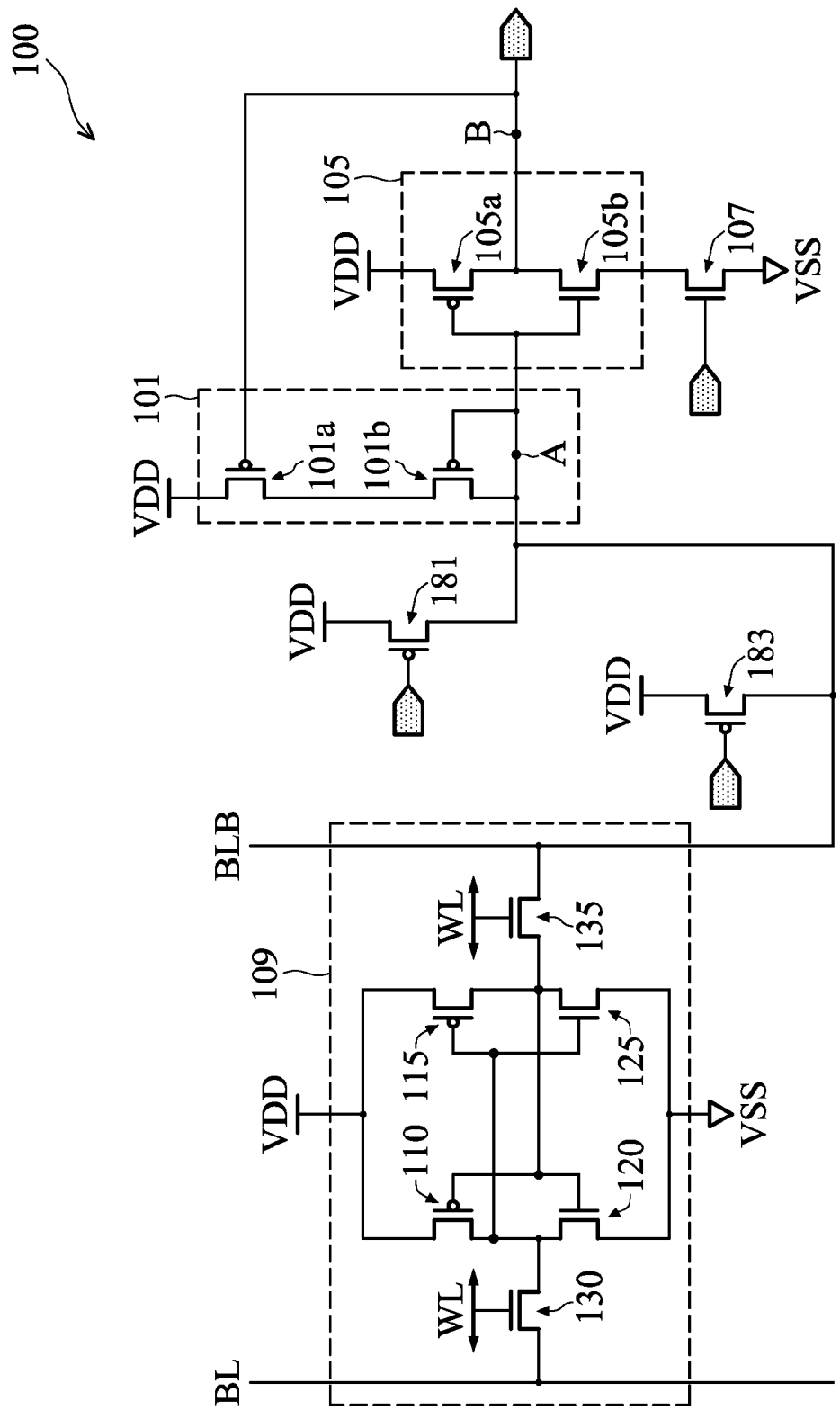
FIG. 1 is a schematic drawing illustrating an exemplary integrated circuit including a keeper coupled with an inverter and a memory cell.

Conventionally, a cycle for accessing data stored in memory cells has a precharge period for precharging the bit line BL and bit line bar BLB to a voltage state, e.g., a high voltage state or "1". The data are then sensed by a sensing circuit to maintain or pull down the voltage states of the bit line BL and bit line bar BLB to output the data. The voltage states of the bit line BL and the bit line bar BLB, however, may undesirably transition because leakage currents flowing through transistors coupled with the bit line BL and/or the bit line bar BLB may pull down their voltage states. The leakage current may become worse if the operation of the memory circuit is at the worst corner of Process-Voltage-Temperature (PVT) variations.

To avoid the undesired transitions of the bit line BL and/or bit line bar BLB, a conventional keeper is connected to the bit line BL and the bit line bar BLB. The conventional keeper is configured to keep the voltage state of the bit line BL and bit line bar BLB. The conventional keeper has two PMOS transistors connected in series. Gates of both PMOS transistors are connected to an output end of the sensing circuit. The output of the sensing circuit can control the PMOS transistors to keep the voltage state at an input end of the sensing circuit. It is found that conventional keeper causes a delay of a transition from low to high on the output end of the sensing circuit if a "1" datum is accessed and to be output.

Based on the foregoing, keepers, integrated circuits, and systems thereof are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary integrated circuit including a keeper coupled with an inverter and a memory cell. An integrated circuit 100 can include a keeper 101 and an inverter 105. The keeper 101 can be coupled with the inverter 105. The inverter 105 can include an input end A and an output end B. The inverter 105 is capable of inverting a voltage state, e.g., a high voltage state, on the input end A to another voltage state, e.g., a low voltage state, on the output end B. In some embodiments, a sensing circuit (not shown) can include the inverter 105 for sensing the transition of the voltage state on the input end A.

The input end A of the inverter 105 is capable of being coupled with a signal line, a global line, a local bit line, a global bit line, a pass gate, a port of a memory cell, or another line that has a loading and is subjected to floating. The keeper 101 is capable of desirably maintaining the voltage state on the input end A of the inverter 105. The keeper 101 can include at least two transistors, e.g., transistors 101a and 101*b*. The transistors 101*a* and 101*b* can each be a PMOS transistor, an NMOS transistor, or any suitable transistor. The transistor 101*a* has a gate being coupled with the output end B of the inverter 105. A source of the transistor 101*a* can be coupled with a power source, e.g., power source VDD. A drain of the transistor 101*a* can be coupled with a source of the transistor 101*b*. The transistor 101*b* can have a gate being coupled with the input end A of the inverter 105. A drain of the transistor 101*b* can be coupled with the input end A of the inverter 105.

In some embodiments, the integrated circuit 100 can include a static random access memory (SRAM) circuit, an embedded SRAM circuit, dynamic random access memory (DRAM) circuit, an embedded DRAM circuit, a non-volatile memory, e.g., FLASH, EPROM, $E^2$PROME, a logic circuit, and/or other memory circuit.

For embodiments using a 6-T SRAM memory cell, the integrated circuit 100 can include a memory array (not shown) including a plurality of word lines WLs and a plurality of bit lines BLs and BLBs. The memory array can include at least one memory cell 109. The memory cell 109 can be coupled with a bit line BL, a bit line bar BLB, a word line WL, a first power source, e.g., power source VDD, and a second power source, e.g., power source VSS or ground, of the memory array. It is noted that though only one memory cell 109 is depicted, other memory cells (not shown) can be coupled with the plurality of word lines WLs and bit lines BLs, BLBs of the memory array. A portion of the memory array may have 8, 16, 32, 64, 128 or more columns that can be arranged in word widths. In some embodiments, the word lines can be laid out substantially orthogonally to the bit lines. In other embodiments, other arrangements of the word lines and bit lines can be provided.

Referring again to FIG. 1, the memory cell 109 can include transistors 110, 115, 120, 125, 130, and 135. In some embodiments, the transistors 110, 120 and 115, 125 can be operative as two cross-latch inverters forming a flip-flop for storing the datum of the memory cell 109. The transistors 130 and 135 can be operative as two pass transistors, access transistors, or pass gates. In some embodiments, the transistors 110 and 115 can be referred to as pull-up transistors and the transistors 120 and 125 can be referred to as pull-down transistors. The pull-up transistors can be configured to pull a voltage state toward the power source VDD. The pull-down transistors can be configured to pull a voltage state toward the power source VSS.

In some embodiments, the source ends of the transistors 110 and 115 can be electrically coupled with the power source VDD. A drain of the transistor 110 can be electrically coupled with a source of the transistor 130, a drain of the transistor 120, and a gate of the transistor 115. A drain of the transistor 115 can be electrically coupled with a source of the transistor 135, a drain of the transistor 125, and a gate of the transistor 110. The sources of the transistors 120 and 125 can be electrically coupled with the power source VSS, e.g., ground, common, or a voltage state that is lower than the power source VDD. The gate of the transistor 110 can be coupled with the gate of the transistor 120. The gate of the transistor 115 can be coupled with the gate of the transistor 125.

Drains of the transistors 130 and 135 can be electrically coupled with the bit line BL and bit line bar BLB, respectively. The gates of the transistors 130 and 135 can be electrically coupled with the word line WL. The bit lines BL, the bit line bar BLB and the word line WL may extend to other memory cells of the memory array. It is noted that the number, type, and disposition of the transistors 110, 115, 120, 125, 130, and 135 are mere examples. One of skill in the art can modify the number, type, and disposition of the transistors to achieve a desired memory array.

Referring again to FIG. 1, the input end A of the inverter 105 can be coupled with the bit line bar BLB. In some embodiments, the integrated circuit 100 can include precharge transistors 181 and 183. The precharge transistors 181 and 183 can be coupled with the power source VDD. Gates of the precharge transistors 181 and 183 are capable of receiving a precharge enable signal to turn on the precharge transistors 181 and 183 for coupling the power source VDD with the bit line bar BLB and the input end A of the inverter 105.

In some embodiments, the integrated circuit 100 can include a transistor 107 coupled with the inverter 105 and a power source, e.g., VSS or ground. The gate of the transistor 107 is capable of receiving a sense amplifier enable signal (SAEN) to turn on or off the transistor 107. The transistor 107 can be turned off and desirably insulate the inverter 105 from the power source VSS during the precharge period. It is noted that the number, type, and disposition of the transistor 107 and the precharge transistors 181 and 183 are merely exemplary. One skilled in the art can modify them to achieve a desired integrated circuit.

Following are descriptions regarding maintaining the voltage state on the input end A and/or outputting a high voltage state signal, e.g., 1, on the output end B of the inverter 105. For accessing the datum stored within the memory cell 109, an access cycle can include a precharge period to precharge the bit line BL and bit line bar BLB to a voltage state, e.g., 1 or a high voltage state. During the precharge period, the precharge transistors 181 and 183 are turned on, coupling the power source VDD with the bit line bar BLB to precharge the bit line bar BLB. After precharging the bit line bar BLB, the precharge transistors 181 and 183 then turned off and the bit line bar BLB is floating. After the precharge period, if the memory cell 109 is selected for access, the word line WL can be charged to a high voltage state to turn on the transistors 130 and 135 of the memory cell 109.

If the datum stored in the memory cell 109 is "0", the transistor 125 is turned off. Since the precharged voltage state on the input end A of the inverter 105 is high, the voltage state on the output end B of the inverter 105 is low. The low voltage state on the output end B of the inverter 105 can turn on the transistor 101*a* to couple the power source VDD with the transistor 101*b*. After the power source VDD is applied to the source of the transistor 101*b*, the transistor 101*b* is turned on. The turned-on transistor 101*b* can couple the power source VDD with the input end A of the inverter 105 to maintain the input end A of the inverter 105 at the high voltage state during the floating of the bit line bar BLB. The keeper 101 can desirably maintain the precharged high voltage state on the input end A of the inverter 105 and the datum "0" of the memory cell 109 can be desirably output on the output end B of the inverter 105.

If the datum stored in the memory cell 109 is "1", the transistor 125 is turned on. The turned-on transistor 125 can couple the bit line bar BLB with the power source VSS to pull down the voltage state of the bit line bar BLB such that the input end A of the inverter 105 goes low and the output end B of the inverter 105 goes high. It is found that if a voltage on the input end A of the inverter 105 is pulled down to a certain voltage level, a voltage at the drain of the transistor 101*a* becomes sufficient low, e.g., IVGSI <threshold voltage ($V_{th}$) of the transistor 101*b*, and the transistor 101*b* can be turned off, decoupling coupling the drain of the transistor 101*a* with the input end A of the inverter 105. The turned-off transistor 101*b* can prevent a current path fighting against pulling down the voltage state on the input end A of the inverter 105 during the voltage state transition from high to low on the input end A. After the voltage state on the input end A of the inverter 105 is further pulled down, the voltage state on the output end B of the inverter 105 can transition to high to turn off the transistor 101a. After the input end A flips to low, the transistors 101a and 101b can desirably maintain the low voltage state on the input end A for outputting the datum "1" on the output end B. From the foregoing, the keeper 101 including the transistors 101a and 101b can maintain the low voltage state on the input end A of the inverter 105 and the datum "1" of the memory cell 109 can be output on the output end B of the inverter 105.

As noted, the conventional keeper consists of two PMOS transistors coupled in series. The gates of both PMOS transistors are coupled to the output of the inverter. The PMOS transistors could not be substantially turned off to cut the current path between the power source VDD and the input end of the inverter until the output end of the inverter is pulled up. In contrary to the conventional keeper, the keeper 101 includes the transistor 101b that has the gate being electrically coupled with the input end A of the inverter 105. The transistor 101b can help to transition the voltage state on the input end A of the inverter 105 that can be inverted to the voltage state on the output end B of the inverter 105. The keeper 101 can also desirably maintain the voltage state on the input end A of the inverter 105 after the voltage state transition. The time period for transitioning the voltage state from high to low on the input end A of the inverter 105 can be desirably reduced.

Figure 2A:
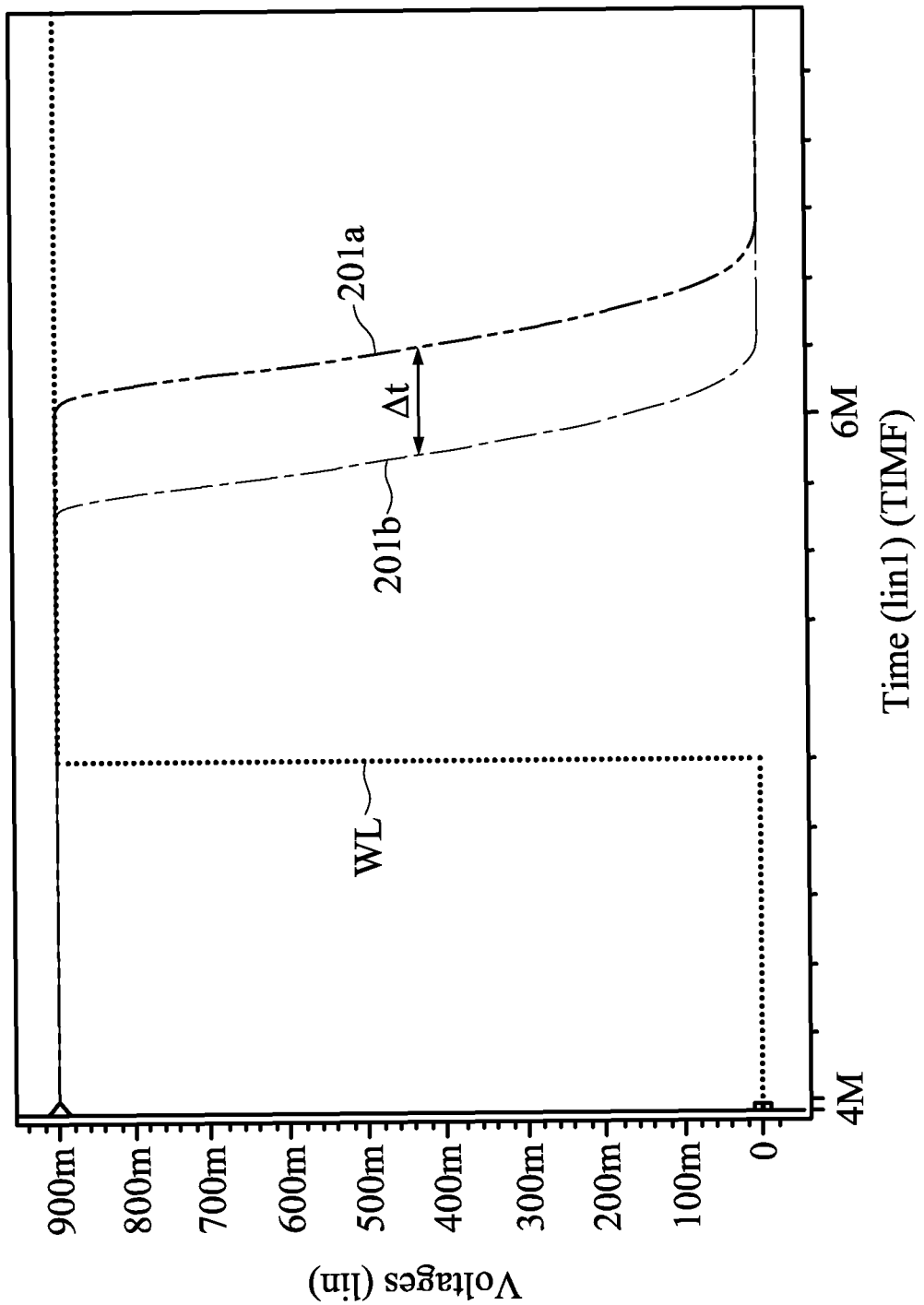
FIG. 2A is a drawing illustrating a simulation result showing voltage state transitions at output ends of inverters of integrated circuits having the conventional keeper and exemplary keeper described in conjunction with FIG. 1.

For some embodiments under the worst scenario of Process-Voltage-Temperature (PVT) variations, e.g., SS/SS/0.90V/–40° C., the keeper 101 can help to transition the voltage state on an output end of the inverter 105 faster than that provided by a conventional keeper by a time difference Δt of about 105 pecoseconds (ps) as shown in FIG. 2A. FIG. 2A is a schematic drawing illustrating a simulation result showing voltage state transitions on output ends of inverters of integrated circuits having the conventional keeper and exemplary keeper described above in conjunction with FIG. 1. In FIG. 2A, the horizontal axis represents time (ns) and the vertical axis represents voltage (mV). A curve 201a represents a voltage transition on an output end of the integrated circuit having the conventional keeper. A curve 201b represents a voltage change on an output end of the integrated circuit 100 having the keeper 101. The output end of the integrated circuit 100 can be an output end of a next level of the inverter 105. As shown in FIG. 2A, after the word line WL transitions from low to high, the curve 201b goes down faster than the curve 201a by the time difference Δt. The keeper 101 can desirably reduce the time delay for accessing the datum stored within the memory cell 109.

Figure 2B:
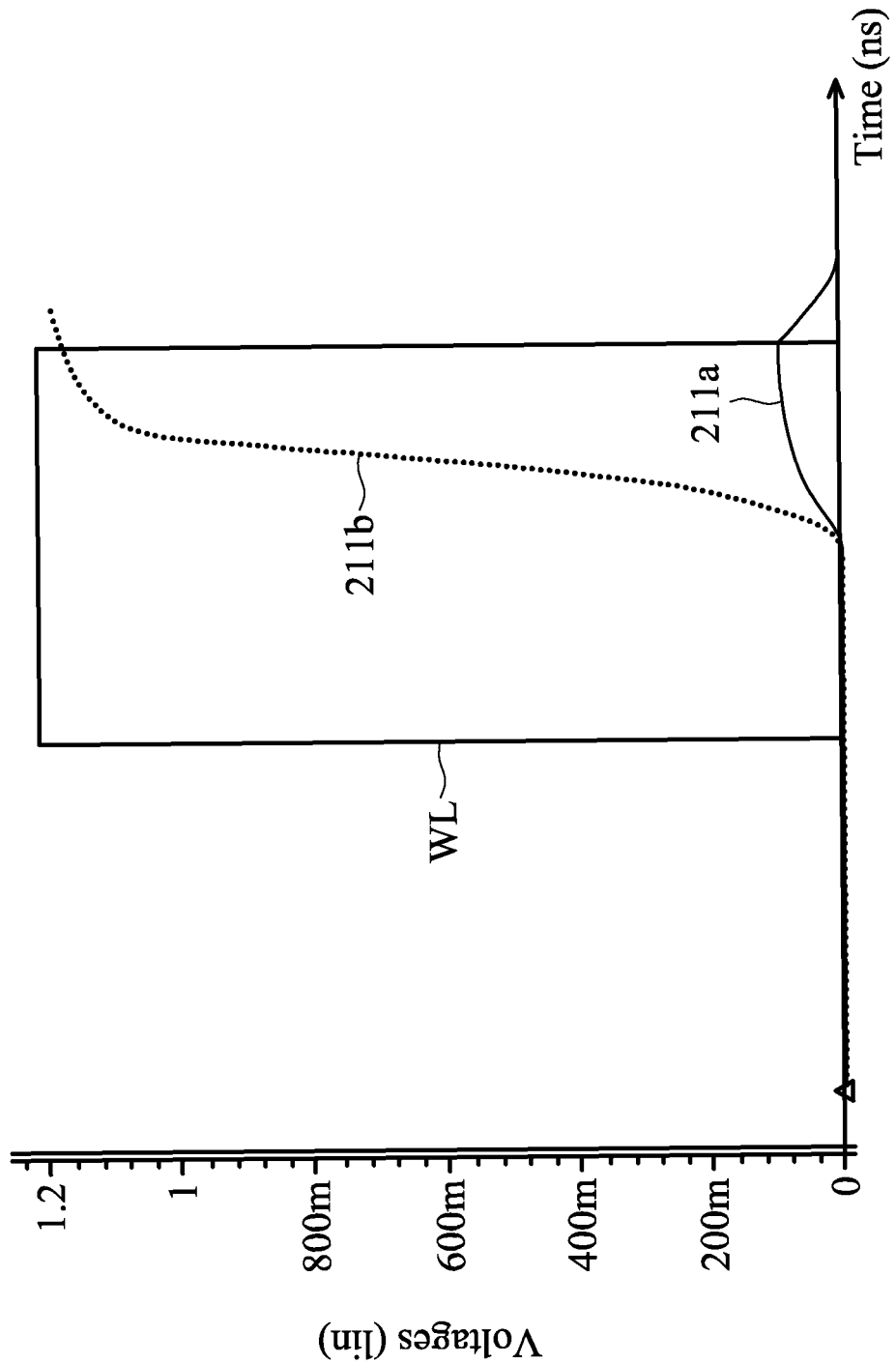
FIG. 2B is a schematic drawing showing a simulation result showing voltage state transitions at an output end of an integrated circuit without a keeper and at an output end of the integrated circuit having the exemplary keeper described in conjunction with FIG. 1.

FIG. 2B is a schematic drawing showing a simulation result showing voltage state transitions on an output end of an integrated circuit without a keeper and at an output end of the integrated circuit having the exemplary keeper described above in conjunction with FIG. 1. In FIG. 2B, the horizontal axis represents time (ns) and the vertical axis represents voltage (mV). A curve 211a represents a voltage change at an output end of the integrated circuit without a keeper. A curve 201b represents a voltage change on the output end B of the integrated circuit 100 having the keeper 101.

As noted, if the datum stored in the memory cell 109 is "0", the transistor 125 (shown in FIG. 1) is turned off and the voltage state on the input end A of the inverter 105 is intended to be high. After the precharge period and before the access of the memory cell 109, the bit line bar BLB and/or the input end A of the inverter 105 are floating. In some embodiments, the turned-off transistor 125 has a leakage current that is substantially large to pull down the voltage state on the input end A of the inverter 105. Since the conventional integrated circuit does not have a keeper to maintain the voltage state on the input end A of the inverter 105, the leakage current of the transistor 125 may pull the voltage state on the input end A of the inverter 105 to low and the voltage state on the output end B of the inverter 105 may flip to high as indicated by the curve 211a in FIG. 2B.

Contrary to the conventional integrated circuit without a keeper, the integrated circuit 100 includes the keeper 101 that can desirably maintain the voltage state on the input end A of the inverter 105. Even if the turned-off transistor 125 has the leakage current that may pull down the voltage state on the input end A of the inverter 105, the low voltage state on the output end B of the inverter 105 can turn on the transistor 101a coupling the power source VDD with the transistor 101b. The transistor 101b is turned on, coupling the power source VDD with the input end A of the inverter 105 to keep the input end A of the inverter 105 at the high voltage state. A current can flow through the transistors 101a and 101b to keep the high voltage state on the input end A. The current flowing through the transistors 101a and 101b can fight with the leakage current of the transistor 125 and may substantially keep the high voltage state on the input end A of the inverter 105.

Figure 3:
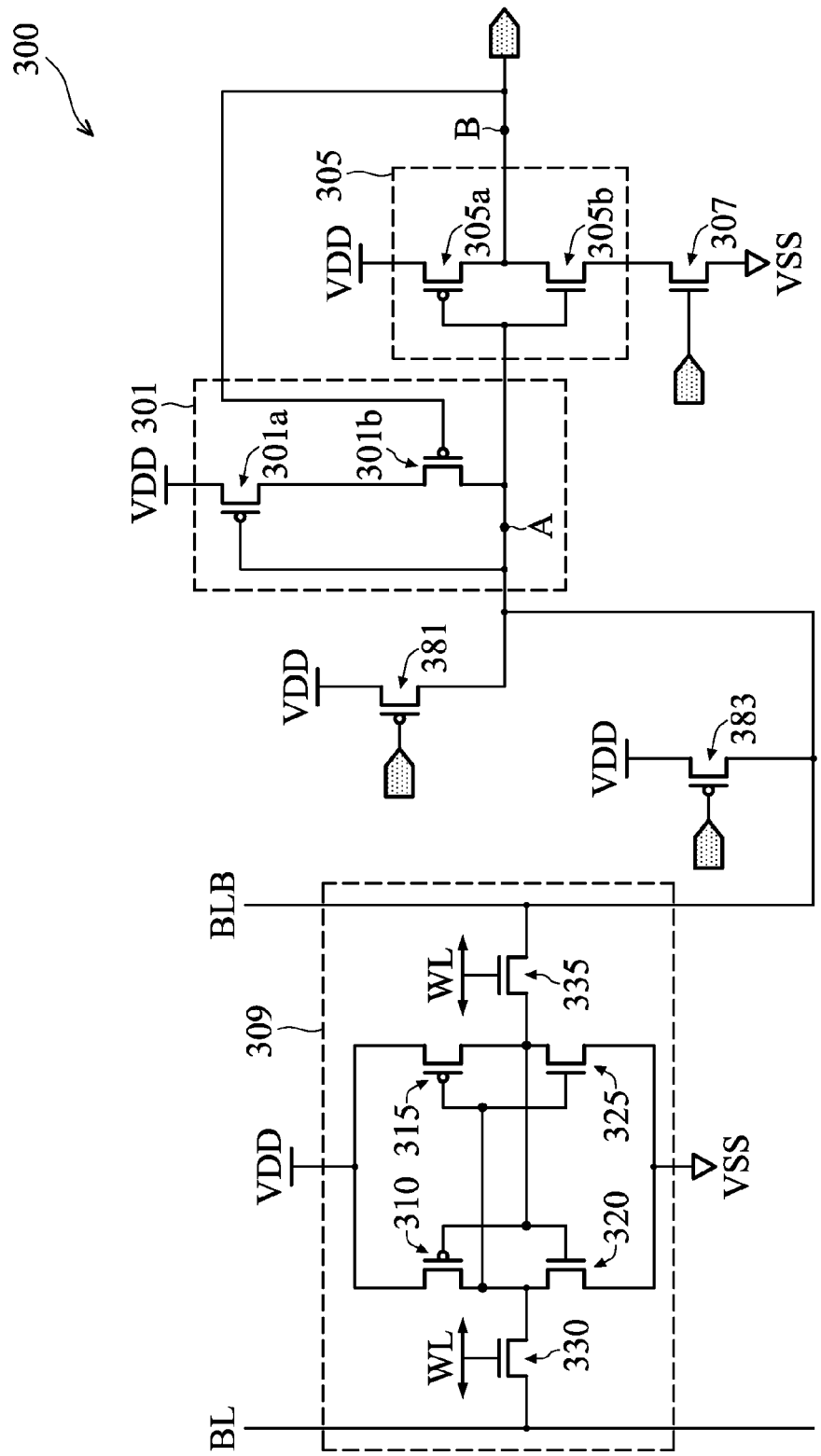
FIG. 3 is a schematic drawing showing an integrated circuit having another exemplary keeper coupled with an inverter.

FIG. 3 is a schematic drawing showing an integrated circuit having another exemplary keeper coupled with an inverter. Items of an integrated circuit 300 in FIG. 3 that are the same or similar items of the integrated circuit 100 in FIG. 1 are indicated by the same reference numerals, increased by 200. In FIG. 3, the keeper 301 can include transistors 301a and 301b. The transistor 301a can have a gate coupled with the input end A of the inverter 305. A source of the transistor 301a can be coupled with a power source, e.g., VDD. A drain of the transistor 301a can be coupled with a source of the transistor 301b. The transistor 301b can have a gate being coupled with the output end B of the inverter 305. A drain of the transistor 301b can be coupled with the input end A of the inverter 305.

The transistor 301a can desirably help to pull down the voltage state on the input end A of the inverter 305 if a high-to-low transition on the input end A occurs. After the voltage state on the input end A of the inverter 305 is substantially pulled to low, the voltage state on the output end B of the inverter 305 can transition to high to turn off the transistor 301b. The keeper 305 including the transistors 301a and 301b then can desirably maintain the voltage state on the input end A of the inverter 305 and the datum "1" of the memory cell 309 can be output on the output end B of the inverter 309.

Figure 4:
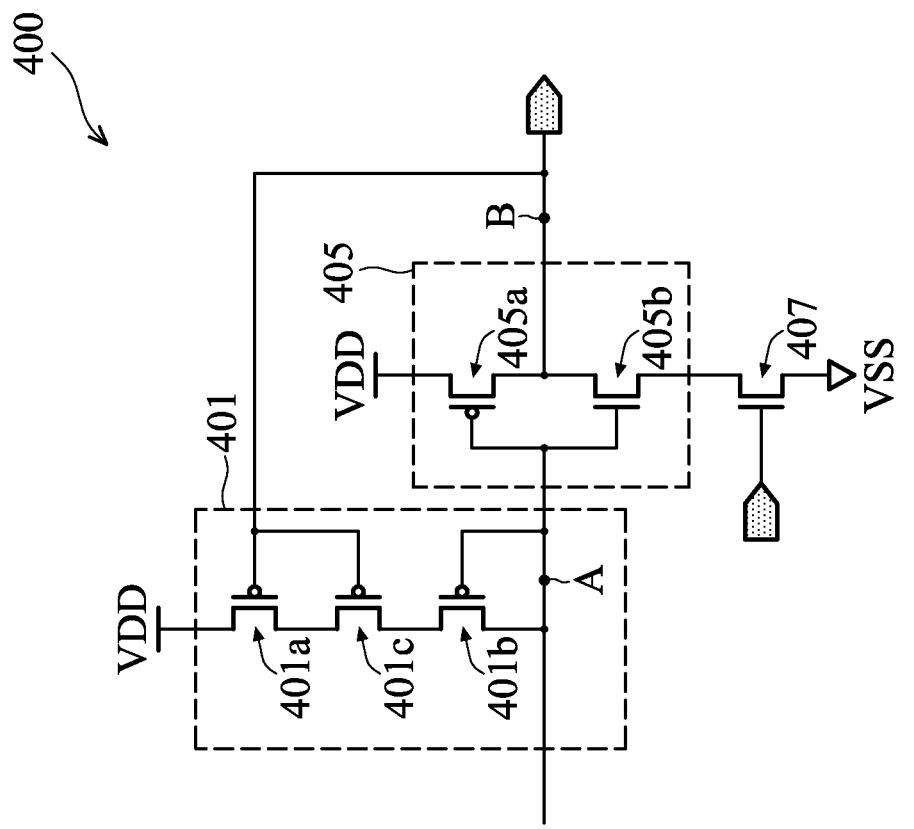
FIG. 4 is a schematic drawing showing an integrated circuit having another exemplary keeper coupled with an inverter.

FIG. 4 is a schematic drawing showing an integrated circuit having another exemplary keeper coupled with an inverter. Items of an integrated circuit 400 in FIG. 4 that are the same or similar items of the integrated circuit 100 in FIG. 1 are indicated by the same reference numerals, increased by 300. In FIG. 4, the keeper 401 can include transistors 401a-401c, which can be coupled in series. Gates of the transistors 401a and 401c can be coupled with an output end B of the inverter 405. A gate of the transistor 401b can be coupled with an input end A of the inverter 405. It is noted that the number of the transistors 401a and 401c is a mere examples. More transistors having gates being coupled with the gates of the transistors 401a and 401c can be added. It is also noted the coupling of gates of the transistors 401a-401c with the input end A and output end B can be modified as shown in FIG. 3.

Figure 5:
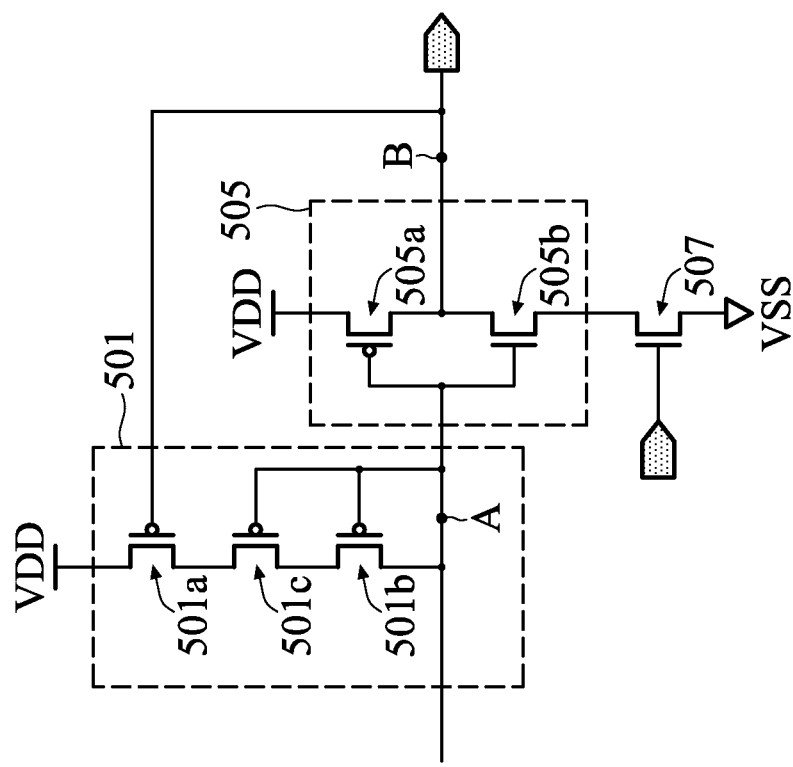
FIG. 5 is a schematic drawing showing an exemplary keeper coupled with an inverter.

FIG. 5 is a schematic drawing showing an exemplary keeper coupled with an inverter. Items of an integrated circuit 500 in FIG. 5 that are the same or similar items of the integrated circuit 100 in FIG. 1 are indicated by the same reference numerals, increased by 400. In FIG. 5, the keeper 501 can include transistors 501a-501c, which can be coupled in series. A gate of the transistor 501a can be coupled with an output end B of the inverter 505. Gates of the transistors 501b-501c can be coupled with an input end A of the inverter 505. It is noted that the number of the transistors 501b-501c is a mere examples. More transistors having gates being coupled with the gates of the transistors 501b-501c can be added. It is also noted the coupling of gates of the transistors 501a-501c with the input end A and output end B can be modified as shown in FIG. 3.

Figure 6:
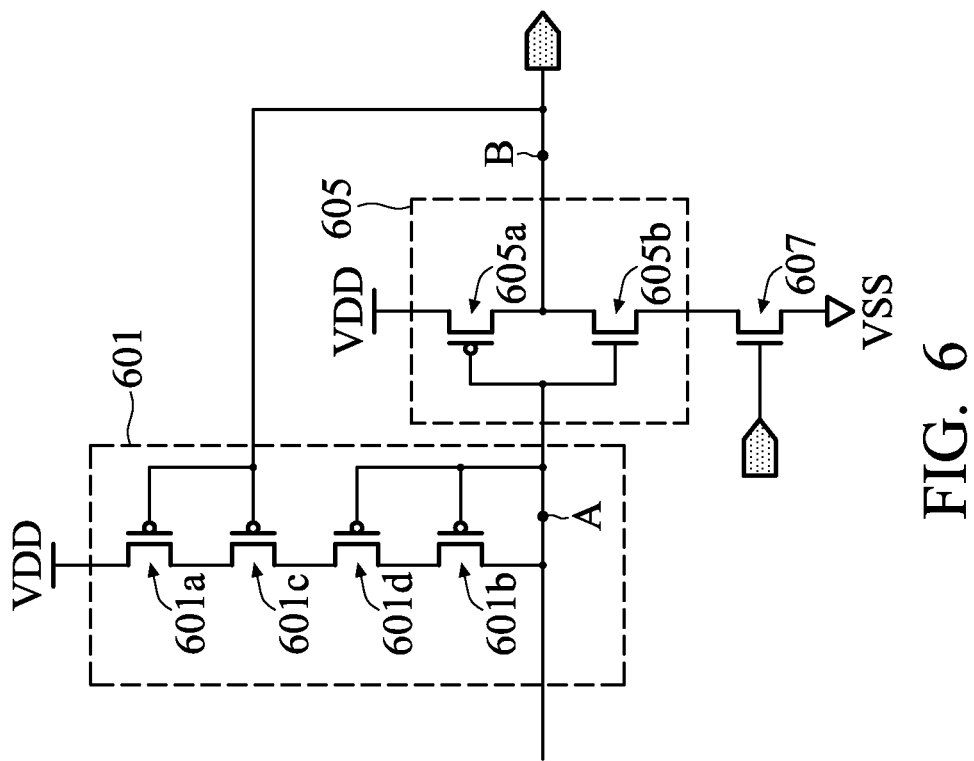
FIG. 6 is a schematic drawing showing an exemplary keeper coupled with an inverter.

FIG. 6 is a schematic drawing showing an exemplary keeper coupled with an inverter. Items of an integrated circuit 600 in FIG. 6 that are the same or similar items of the integrated circuit 100 in FIG. 1 are indicated by the same reference numerals, increased by 500. In FIG. 6, the keeper 601 can include transistors 601a-601d, which can be coupled in series. Gates of the transistors 601a and 601c can be coupled with an output end B of the inverter 605. Gates of the transistors 601b and 601d can be coupled with an input end A of the inverter 605. It is noted that the number of the transistors 601a-601d is a mere examples. More transistors having gates being coupled with the gates of the transistors 601a, 601c and/or the gates of the transistors 601b, 601d can be added. It is also noted the coupling of gates of the transistors 601a-601d with the input end A and output end B can be modified as shown in FIG. 3.

Figure 7:
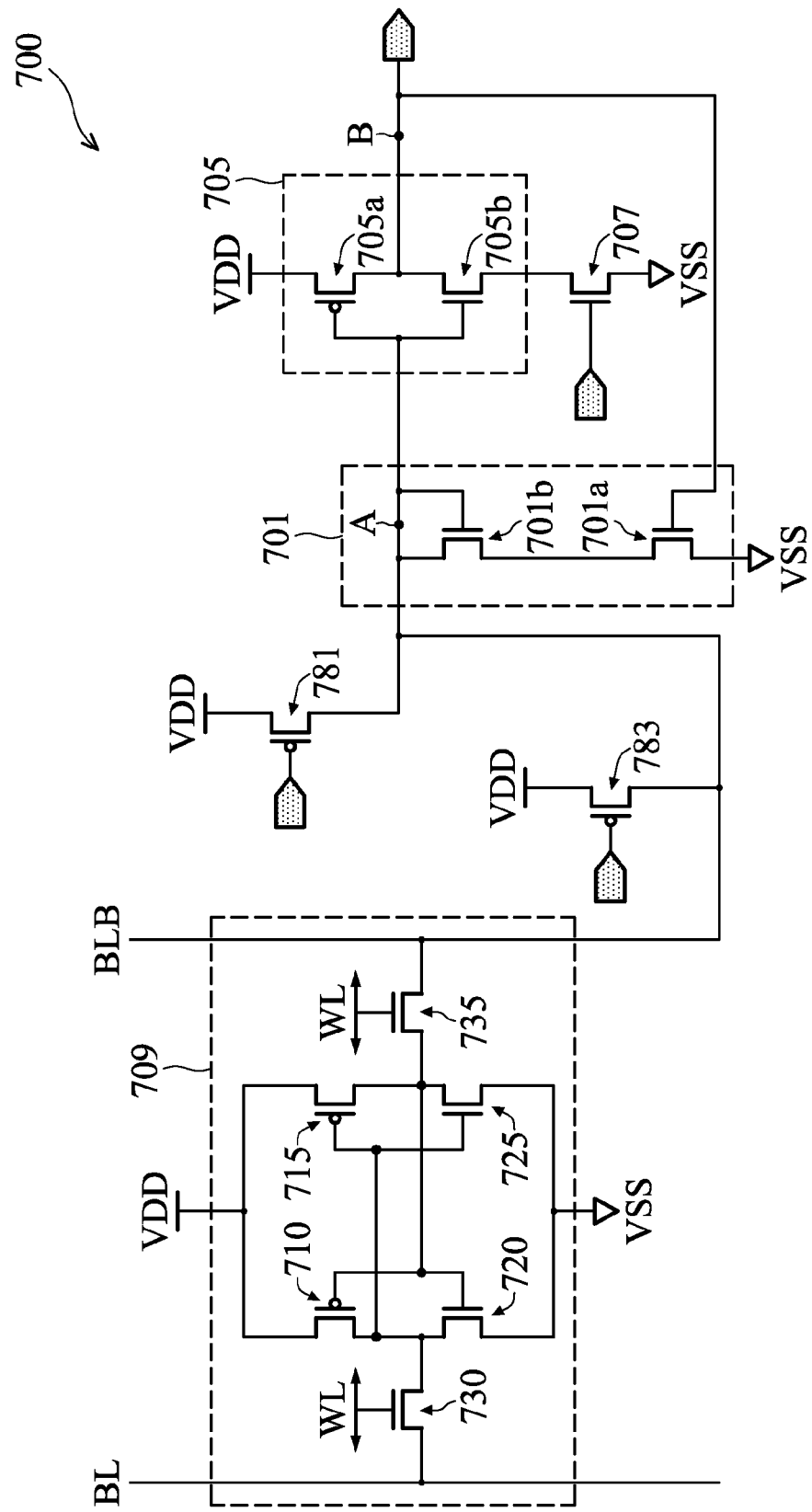
FIG. 7 is a schematic drawing showing an integrated circuit including an exemplary keeper coupled with an inverter and a memory cell.

FIG. 7 is a schematic drawing showing an integrated circuit including an exemplary keeper coupled with an inverter and a memory cell. Items of an integrated circuit 700 in FIG. 7 that are the same or similar items of the integrated circuit 100 in FIG. 1 are indicated by the same reference numerals, increased by 600. In FIG. 7, the keeper 701 can include transistors 701a and 701b, e.g., NMOS transistors, which can be coupled in series. A gate of the transistor 701a can be coupled with an output end B of the inverter 705. A gate of the transistor 701b can be coupled with an input end A of the inverter 705. The operation of the transistors 701a and 701b is opposite to that of the transistors 101a and 101b, respectively. For example, the transistor 701b can desirably help to pull up the voltage state on the input end A of the inverter 705 if a low-to-high transition on the input end A occurs. After the voltage state on the input end A of the inverter 705 is pulled to high, the voltage state of the output end B of the inverter 705 can transition to low to turn off the transistor 701a. The keeper 705 including the transistors 701a and 701b can desirably maintain the voltage state on the input end A of the inverter 705. It is noted that the number and disposition of the transistors 701a and 701b shown in FIG. 7 are mere examples. Numbers and/or dispositions of the transistors described above in conjunction with FIGS. 3-6 can be applied to the embodiment shown in FIG. 7.

Figure 8:
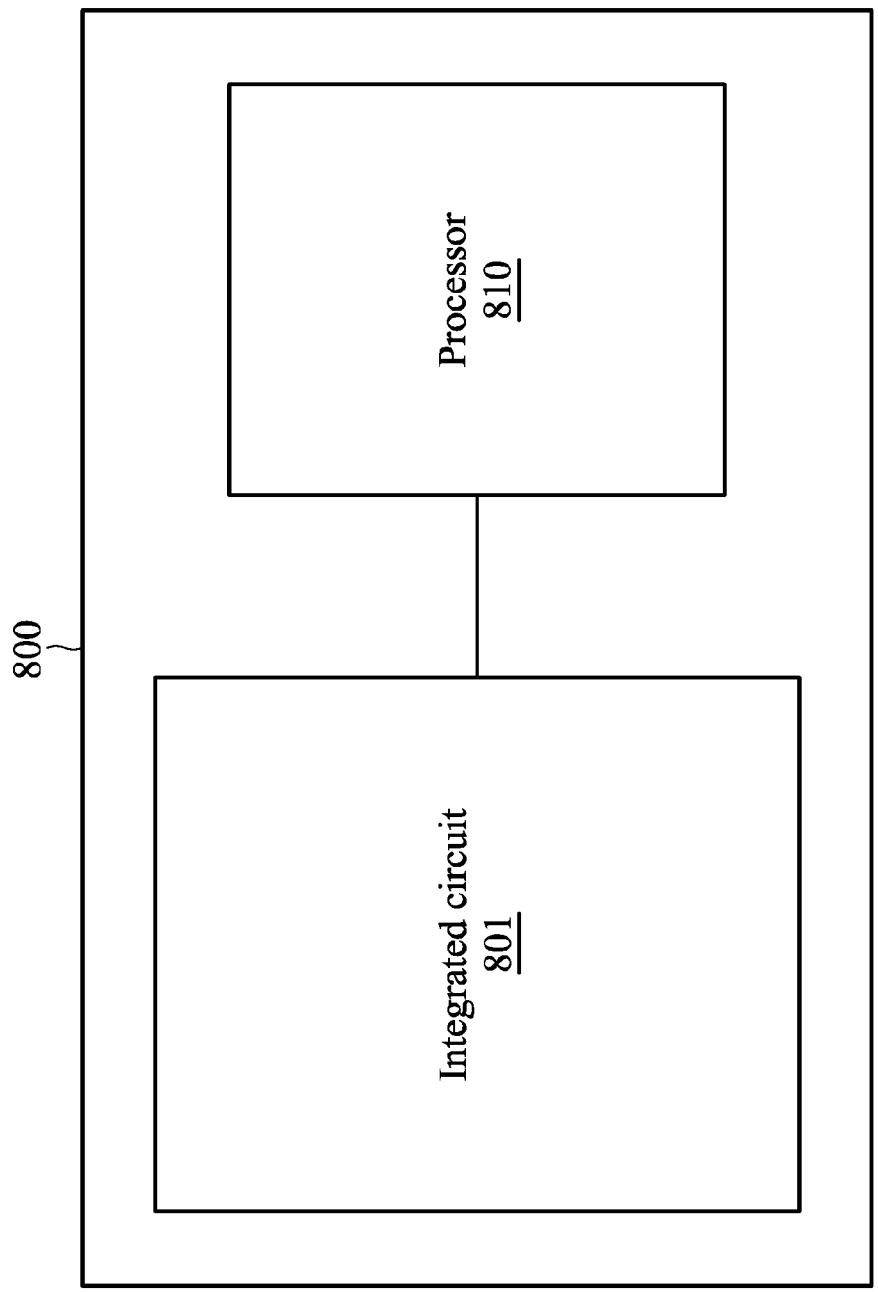
FIG. 8 is a schematic drawing showing a system including an exemplary memory circuit.

FIG. 8 is a schematic drawing showing a system including an exemplary memory circuit. In FIG. 8, a system 800 can include a processor 810 coupled with an integrated circuit 801. The integrated circuit 801 can be similar to one of the integrated circuits 100, 300, 400, 500, 600, and 700 described above in conjunction with FIGS. 1 and 3-7, respectively. The processor 810 can be a processing unit, central processing unit, digital signal processor, or other processor that is suitable for accessing data of memory circuit.

In some embodiments, the processor 810 and the integrated circuit 801 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 800 including the integrated circuit 801 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A keeper of an integrated circuit, the keeper comprising:
    a first transistor having a first gate being electrically coupled with an output end of an inverter; and
    a second transistor coupled with the first transistor in series, the first transistor and the second transistor being between a power source and an input end of the inverter, the second transistor having a second gate being electrically coupled with the input end of the inverter.

2. The keeper of claim 1, wherein the second transistor further comprises a drain and the drain is coupled with the second gate.

3. The keeper of claim 1, wherein the first transistor and the second transistor are the same type transistors.

4. The keeper of claim 1, wherein the second transistor further comprises a source and the source is electrically coupled with the power source.

5. The keeper of claim 1 further comprising a third transistor coupled between the first and second transistors, wherein the third transistor includes a third gate being coupled with the output end of the inverter.

6. The keeper of claim 1 further comprising a fourth transistor coupled between the first and second transistors, wherein the fourth transistor includes a fourth gate being coupled with the input end of the inverter.

7. The keeper of claim 1, wherein the second transistor is capable of providing a current to help transitioning the input end of the inverter from a first voltage state to a second voltage state.

8. An integrated circuit comprising:
    an inverter having an input end and an output end; and
    a keeper comprising:
        a first transistor having a first gate being electrically coupled with the output end of the inverter; and
        a second transistor coupled with the first transistor in series, the first transistor and the second transistor being between a power source and the input end of the inverter, the second transistor having a second gate being electrically coupled with the input end of the inverter.

9. The integrated circuit of claim 8, wherein the second transistor further comprises a drain and the drain is coupled with the second gate.

10. The integrated circuit of claim 8, wherein the second transistor further comprise a source and the source is electrically coupled with the power source.

11. The integrated circuit of claim 8, wherein the first transistor and the second transistor are the same type transistor.

12. The integrated circuit of claim 11, wherein the second transistor is capable of providing a current path to further pull down a voltage state on the input end of the inverter during a voltage state transition from high to low on the input end.

13. The integrated circuit of claim 12, wherein the second transistor is capable of providing the current path if a voltage difference between a source and the second gate of the second transistor is smaller than a threshold voltage of the second transistor.

14. The integrated circuit of claim 8, wherein the keeper further comprises a third transistor coupled between the first and second transistors, wherein the third transistor includes a third gate being coupled with the output end of the inverter.

15. The integrated circuit of claim 8, wherein the keeper further comprises a fourth transistor coupled between the first and second transistors, wherein the fourth transistor includes a fourth gate being coupled with the input end of the inverter.

16. A method of accessing a datum stored in a memory cell, the method comprising:
 precharging a bit line to a first voltage state, the bit line being coupled with an input end of an inverter;
 accessing a datum stored in a memory cell coupled with the bit line, the datum having a second voltage state that is different from the first voltage state; and
 at least partially pulling down the first voltage state toward the second voltage state on the input end of the inverter by a keeper, comprising:
  biasing a gate of a first transistor by a voltage level at an output end of the inverter; and
  biasing a gate of a second transistor by a voltage level at the input end of the inverter, the second transistor being electrically coupled with the first transistor in series.

17. The method of claim 16 further comprising maintaining the second voltage state on the input end of the inverter by the keeper.

18. The method of claim 16, wherein at least partially pulling down the first voltage state toward the second voltage state on the input end of the inverter further comprises:
 biasing the gate of the second transistor, during a period a voltage level on the input end of the inverter being pulled from the first voltage state toward the second voltage state, such that a voltage difference between a source and the gate of the second transistor is smaller than a threshold voltage of the second transistor.

* * * * *